(12) United States Patent
Wilson

(10) Patent No.: US 9,529,963 B1
(45) Date of Patent: Dec. 27, 2016

(54) METHOD AND SYSTEM FOR PARTITIONING A VERIFICATION TESTBENCH

(71) Applicant: PMC-SIERRA US, INC., Sunnyvale, CA (US)

(72) Inventor: Theodore Andrew Wilson, Vancouver (CA)

(73) Assignee: Microsemi Storage Solutions (U.S.), Inc., Aliso Viejo, CA (US)

(*) Notice: Subject to any disclaimer, the term of this patent is extended or adjusted under 35 U.S.C. 154(b) by 0 days.

(21) Appl. No.: 14/859,158

(22) Filed: Sep. 18, 2015

Related U.S. Application Data

(60) Provisional application No. 62/139,416, filed on Mar. 27, 2015.

(51) Int. Cl.
*G06F 17/50* (2006.01)
*G01R 31/28* (2006.01)

(52) U.S. Cl.
CPC ....... *G06F 17/5081* (2013.01); *G01R 31/2851* (2013.01); *G06F 17/5009* (2013.01)

(58) Field of Classification Search
CPC .............. G06F 17/5022; G06F 17/5027; G06F 17/5081; G06F 2217/86; G06F 17/5045; G06F 11/263; G06F 11/2205; G06F 11/3409; G06F 17/504; G06F 11/26; G06F 13/22; G06F 13/4291; G06F 8/44; G06F 8/52; G06F 11/261

USPC .................................. 716/100–108, 136–139
See application file for complete search history.

(56) References Cited

U.S. PATENT DOCUMENTS

| | | | |
|---|---|---|---|
| 6,470,482 B1 | 10/2002 | Rostoker et al. | |
| 8,578,309 B2 | 11/2013 | Mehta et al. | |
| 8,782,580 B2 | 7/2014 | Jain et al. | |
| 8,782,592 B2 | 7/2014 | Mansouri et al. | |
| 2005/0198597 A1* | 9/2005 | Zhu | G06F 11/3608 716/103 |
| 2013/0290919 A1* | 10/2013 | Narayanaswamy | G06F 17/5009 716/106 |
| 2014/0052430 A1* | 2/2014 | Suresh | G06F 17/5045 703/14 |

* cited by examiner

*Primary Examiner* — Binh Tat
(74) *Attorney, Agent, or Firm* — Dennis R. Haszko

(57) ABSTRACT

A method of partitioning a verification test bench, the method comprising: receiving a source code of the verification test bench, the source code comprising reactive components for sending test traffic to a design under test (DUT) and for receiving test traffic from the DUT, the source code further comprising analytic components for verifying the test traffic between the reactive components and the DUT; identifying the analytic components in the source code; compiling the reactive components and the DUT into a first executable test bench that can be run in a regression to generate test traffic between the reactive components and the DUT; and compiling the analytic components into a second executable test bench that can be run separately from the first executable test bench in order to verify the test traffic.

9 Claims, 5 Drawing Sheets

METHOD AND SYSTEM FOR PARTITIONING A VERIFICATION TESTBENCH

CROSS-REFERENCE TO RELATED APPLICATIONS

This application claims the benefit of priority of U.S. Provisional Patent Application No. 62/139,416, filed Mar. 27, 2015, which is incorporated herein by reference in its entirety.

FIELD

The present disclosure relates to verification of integrated circuit designs.

BACKGROUND

A verification test bench is developed to test an integrated circuit design and determine whether the integrated circuit design complies with the functional specification of the integrated circuit design. The design of an integrated circuit is a complex project that typically involves the cooperation of many teams of engineers. Between the start of planning the high-level architecture to taping out the low-level photomasks, the integrated circuit design undergoes successive back-and-forth iterations of developing the design, verifying the design, and fixing the design.

Verification methodology generally follows this iterative behavior of finding and fixing issues in the integrated circuit design. However, it is not always possible to have a complete verification test bench for verifying and fixing the integrated circuit design from inception. Therefore, a realistic verification methodology involves iteratively developing the verification test bench alongside the integrated circuit design while finding and fixing issues in the integrated circuit design.

It is desirable to develop and bring integrated circuit devices to market as quickly as possible. Therefore, it would be advantageous to accelerate the iterative process of developing a verification test bench alongside the integrated circuit development.

BRIEF DESCRIPTION OF THE DRAWINGS

Embodiments of the present disclosure will now be described, by way of example only, with reference to the attached Figures.

DETAILED DESCRIPTION

Figure 1:
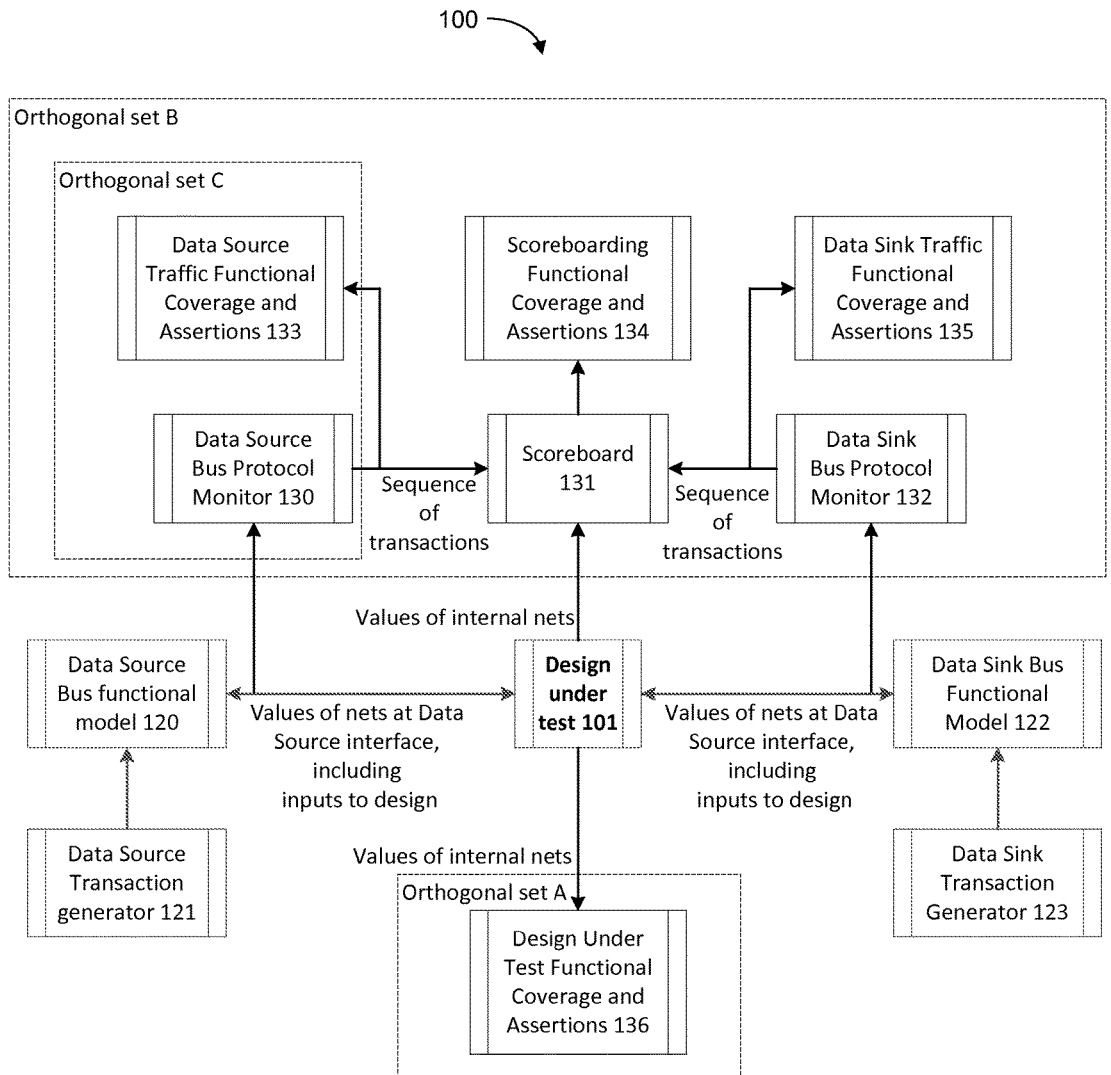
FIG. 1 is a block diagram of a verification test bench according to an embodiment of the present disclosure.

Generally, the present disclosure provides a method and system for partitioning a verification test bench. The method comprises receiving a source code of the verification test bench, wherein the source code comprises reactive components for sending test traffic to a design under test (DUT) and for receiving test traffic from the DUT, and the source code further comprises analytic components for verifying the test traffic between the reactive components and the DUT. The method further comprises identifying the analytic components in the source code, compiling the reactive components and the DUT into a first executable test bench that can be run in a regression to generate test traffic between the reactive components and the DUT, and compiling the analytic components into a second executable test bench that can be run separately from the first executable test bench in order to verify the test traffic.

Partitioning the verification test bench into reactive components and analytic components promotes independent development of the reactive components and the analytic components, which in turn facilitates accelerating the development schedule of the verification test bench.

One aspect of the present disclosure provides a method of partitioning a verification test bench. The method comprises receiving a source code of the verification test bench, the source code comprising reactive components for sending test traffic to a design under test (DUT) and for receiving test traffic from the DUT, the source code further comprising analytic components for verifying the test traffic between the reactive components and the DUT, identifying the analytic components in the source code, compiling the reactive components and the DUT into a first executable test bench that can be run in a regression to generate test traffic between the reactive components and the DUT, and, compiling the analytic components into a second executable test bench that can be run separately from the first executable test bench in order to verify the test traffic. The method may comprise identifying specific programming language constructs as the analytic components, identifying protocol monitors as analytic components, identifying functional coverage definitions as analytic components, and/or identifying assertions as analytic components. Identifying the analytic components in the source code may be based on an analysis of information flow within the source code. The method may comprise identifying the analytic components by a single direction of information flow from the DUT to the analytic components, without any information flow back to the DUT or between separate analytic components. The method may comprise identifying a first orthogonal portion of the analytic components, identifying a second orthogonal portion of the analytic components, compiling the first orthogonal portion of the analytic components into a third executable test bench that can be run in a regression, and, compiling the second orthogonal portion of the analytic components into a fourth executable test bench that can be run separately from the third executable test bench. The regression may be a simulation run or an emulation run.

Another aspect of the present disclosure provides a method of testing a design under test (DUT) using a verification test bench. The method comprises separating a source code of the verification test bench into reactive components and analytic components, the reactive components for sending test traffic to a design under test (DUT) and for receiving test traffic from the DUT, the analytic components for verifying the test traffic between the reactive components and the DUT, compiling the reactive components and the DUT into a first executable test bench, compiling the analytic components into a second executable test bench, running the first executable test bench on a simulator to generate test traffic between the reactive components and the DUT, and, separately running the second executable test bench to verify the test traffic. The method may comprise separating the analytic components based on specific programming language constructs, and/or based on an analysis of information flow within the source code. The method may comprise separating the source code into a first orthogonal portion of the analytic components, separating the source code into a second orthogonal portion of the analytic components, compiling the first orthogonal portion of the analytic components into a third executable test bench, compiling the second orthogonal portion of the analytic components into a fourth executable test bench, running the third executable test bench on a simulator, and, running the fourth executable test bench separately from the third executable test bench. The method may comprise recording the test traffic generated from the first executable test bench simulation, and, providing the test traffic to the second executable test bench simulation to verify the test traffic. The method may comprise storing the recorded test traffic, and, iteratively updating the analytic components and providing the stored test traffic to the second executable test bench simulation, in order to improve the verification of the test traffic.

Another aspect of the present disclosure provides a method of testing a design under test (DUT) using a verification test bench. The method comprises separating a source code of the verification test bench into reactive components and analytic components, the reactive components for sending test traffic to a design under test (DUT) and for receiving test traffic from the DUT, the analytic components for verifying the test traffic between the reactive components and the DUT, compiling the reactive components and the DUT into a first executable test bench, compiling the analytic components into a second executable test bench, running the first executable test bench on an emulator to generate test traffic between the reactive components and the DUT, and, separately running the second executable test bench to verify the test traffic. The method may comprise recording the test traffic generated from the first executable test bench emulation, and, providing the test traffic to the second executable test bench emulation to verify the test traffic. The method may comprise storing the recorded test traffic, and, iteratively updating the analytic components and providing the stored test traffic to the second executable test bench emulation, in order to improve the verification of the test traffic.

Other aspects and features of the present disclosure will become apparent to those ordinarily skilled in the art upon review of the following description of specific embodiments in conjunction with the accompanying figures.

FIG. 1 is a block diagram of a verification test bench 100 according to an embodiment of the present disclosure. The verification test bench 100 comprises various components for testing a design under test (DUT) 101.

The verification test bench components include a data source bus functional model (source BFM) 120, a data source transaction generator 121, a data sink bus functional model (sink BFM) 122, and a data sink transaction generator 123, which together represent reactive components of the verification test bench 100. The components are referred to as "reactive" because the components 120-123 participate in generating, sending and receiving test traffic to and from the DUT 101. In other words, the reactive components 120-123 provide stimulus and feedback to the DUT 101 in order to cause the DUT 101 to function as in an application environment.

The verification test bench 100 further comprises a data source bus protocol monitor 130, a scoreboard 131, a data sink bus protocol monitor 132, data source traffic functional coverage and assertions 133, scoreboarding functional coverage and assertions 134, data sink traffic functional coverage and assertions 135, and DUT functional coverage and assertions 136 which together represent analytic components of the verification test bench 100. These components are referred to as "analytic" because the components 130-136 only receive test traffic from the reactive components 120-123 and from the DUT 101. The analytic components 130-136 do not provide stimulus or feedback to the DUT 101.

By organizing the verification test bench 100 into reactive components 120-123 and analytic components 130-136, the development of the reactive components may proceed independently of the development of the analytic components, and vice versa. Accordingly, the independent development of separate components of the verification test bench 100 facilitates accelerating the development schedule for the verification test bench 100.

In addition to organizing the verification test bench 100 into independently-developed reactive and analytic components, according to embodiments of the present disclosure, the analytic components may be further divided into orthogonal sets. For example, FIG. 1 shows that the DUT functional coverage and assertions 136 is part of an orthogonal set A, and that analytic components 130-135 are part of an orthogonal set B. The orthogonal sets A and B do not share information flow so analytic components of one orthogonal set may be developed independently of the other.

The orthogonal set B may be further partitioned, for example, by grouping the data source traffic functional coverage and assertions 133 and the data source bus protocol monitor 130 in an orthogonal set C that is a subset of the orthogonal set B. This partitioning would be possible if the data source traffic functional coverage and assertions 133 and the data source bus protocol monitor 130 are present in each partitioned test bench.

Verification of an integrated circuit design requires definitions of required design behavior and necessary operating conditions or input. In the verification test bench 100, the integrated circuit design is the DUT 101 and the necessary operation conditions or input is provided by the reactive components 120-123, which represent a protocol transceiver model for the DUT 101. The analytic components 130-136 represent definitions of required design behavior to be exhibited by both the DUT 101 and the reactive components.

Assertions are definitions of the required design behavior that confirm that the design operates correctly. Applying assertions to the observed operation of the design requires that information flow only from design, and test bench interacting with the design, to the assertions.

Functional coverage defines the set of operating conditions under which the assertions must be shown to be true. Confirming that all relevant operating conditions have been covered (i.e., that functional coverage is complete) requires information flow only from the design, and from test bench components interacting with the design, to the equivalent of traffic assertions that confirm specific desired cases have been observed.

A formal proof of design operation is a special or exhaustive proof that walks the design state through all possible relevant states to show that it is not possible (given some constraint on inputs) that the design can ever violate specific assertions. Confirming that all relevant design states have been observed without failing any assertions on correct operation is another type of analytics called code coverage. Together, all of the analytics that confirm both correct design operation, and required coverage of design stimulus and state, form a type of "executable verification contract".

These analytics form a contract because they define the requirements of the verification task. These are executable when implemented and compiled into a test bench. This ability to produce and apply an executable contract to the verification of the design should rapidly result in high quality designs. However, the executable contract (that is, the requirements defined by the analytic components of the verification test bench) itself must be also be iteratively developed, discovered and corrected. If this development process is not rapid enough, then completion of the executable contract races project completion dates and verification may be incomplete at critical milestones.

The executable contract for verification is comprised of analytical constructs native to verification programming languages. Examples of these include functional coverage, cross coverage and assertions. Ideally, this executable contract would be present and correct at the start of a project. However, more typically these elements are developed during the course of a project, and even towards the end of a project.

A late start of the executable contract means that the contract is not available to definitively assess progress towards completion of well-defined goals, and sometimes the project ends without the executable contract being completed. This means that the verification and design teams at the end of the project typically cannot easily assess status against some objectives because statistics relevant to the objectives are not being measured. Measurements are not available because the relevant analytics were not completed.

A key limiting step for completion of the executable contract for verification of a design is the rate at which the digital design can be stimulated with adequate traffic and operating conditions. The present disclosure describes a method and system of partitioning a verification test bench so that the executable contract (i.e., the analytic components) can be developed independently of the stimulus and traffic generating portion of the test bench (i.e., the reactive components). In further embodiments, the method and system also comprise capturing and storing stimulus and test bench traffic from the reactive test bench, and re-using this information for iteratively developing the analytic components of the test bench.

Figure 2:
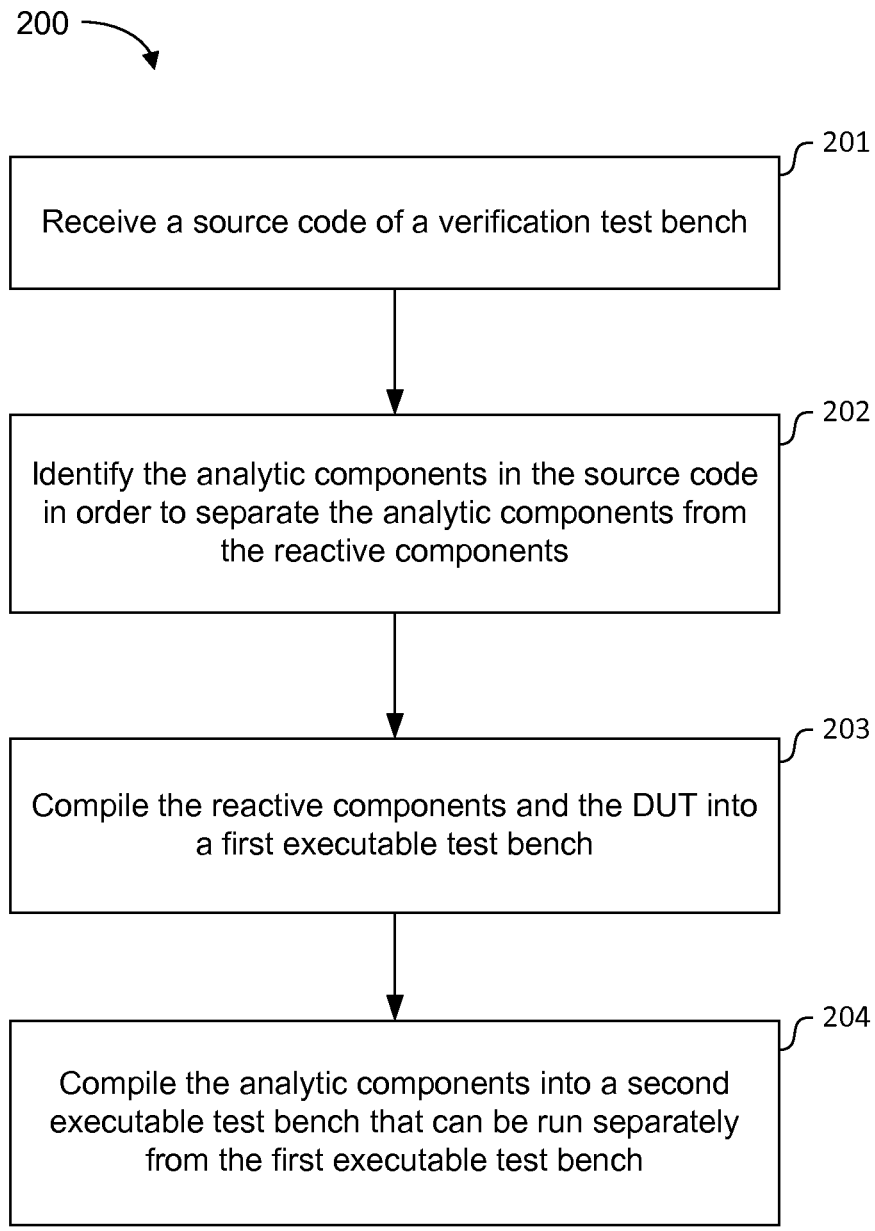
FIG. 2 is a flowchart of a method for partitioning a verification test bench, according to an embodiment of the present disclosure.

FIG. 2 is a flowchart of a method for partitioning a verification test bench, according to an embodiment of the present disclosure. The method 200 comprises, at 201, receiving a source code of the verification test bench 100. The source code comprises reactive components for generating and sending test traffic to a DUT 101 and for receiving test traffic from the DUT 101. The source code further comprises analytic components for monitoring the traffic between the reactive components and the DUT 101.

The method 200 comprises, at 202, identifying the analytic components in the source code. By identifying the analytic components, the method 200 can logically separate the analytic components from the reactive components.

The method finally partitions the verification test bench at 203 and 204, by compiling two executable test benches that are independent of each other. At 203, the method compiles the reactive components and the DUT 101 into a first executable test bench that can be run in a simulator to generate test traffic between the reactive components and the DUT 101. At 204, the method compiles the analytic components into a second executable test bench that can be run separately from the first executable test bench in order to verify the test traffic. Partitioning the verification test bench 100 into independently-executable reactive and analytic components allows for capturing and storing stimulus and test bench traffic from the reactive test bench, and re-using this information for iteratively developing the analytic components of the test bench.

A verification test bench may be executed in a simulation or emulation. Simulators operate at lower speeds than circuit emulators, but circuit emulators typically have a much higher cost. Both simulators and emulators provide an ability to stimulate and observe the design, and using either represents an opportunity cost—a verification team has to make choices of what traffic to run through which version of the integrated circuit design, and which observations to take, throughout the project. Each batch (regression) simulation and/or emulation run must be rerun on a regular basis to ensure features have not been broken as the integrated circuit design progresses. The opportunity cost is represented as the time and resources consumed for each of these regression runs.

In an embodiment, the present disclosure provides a re-simulation system in a verification test bench that is partitioned into analytic and reactive components. The partitioned test bench and the re-simulation system reduce the necessity of re-running or re-compiling the slow reactive test bench. Furthermore, distinct analytical features of the analytical test bench can be flexibly enabled and disabled without impacting either the slow reactive test bench regressions or orthogonal analytics regression runs.

For the purposes of a re-simulation system, the test bench can be implemented within a simulator, an emulator or on a lab bench, as any of these can act as the source of design activity for analysis. Some data sources, such as emulators and lab benches may be highly constrained environments for embedded analytics but are well suited for offline analytics.

Figure 3:
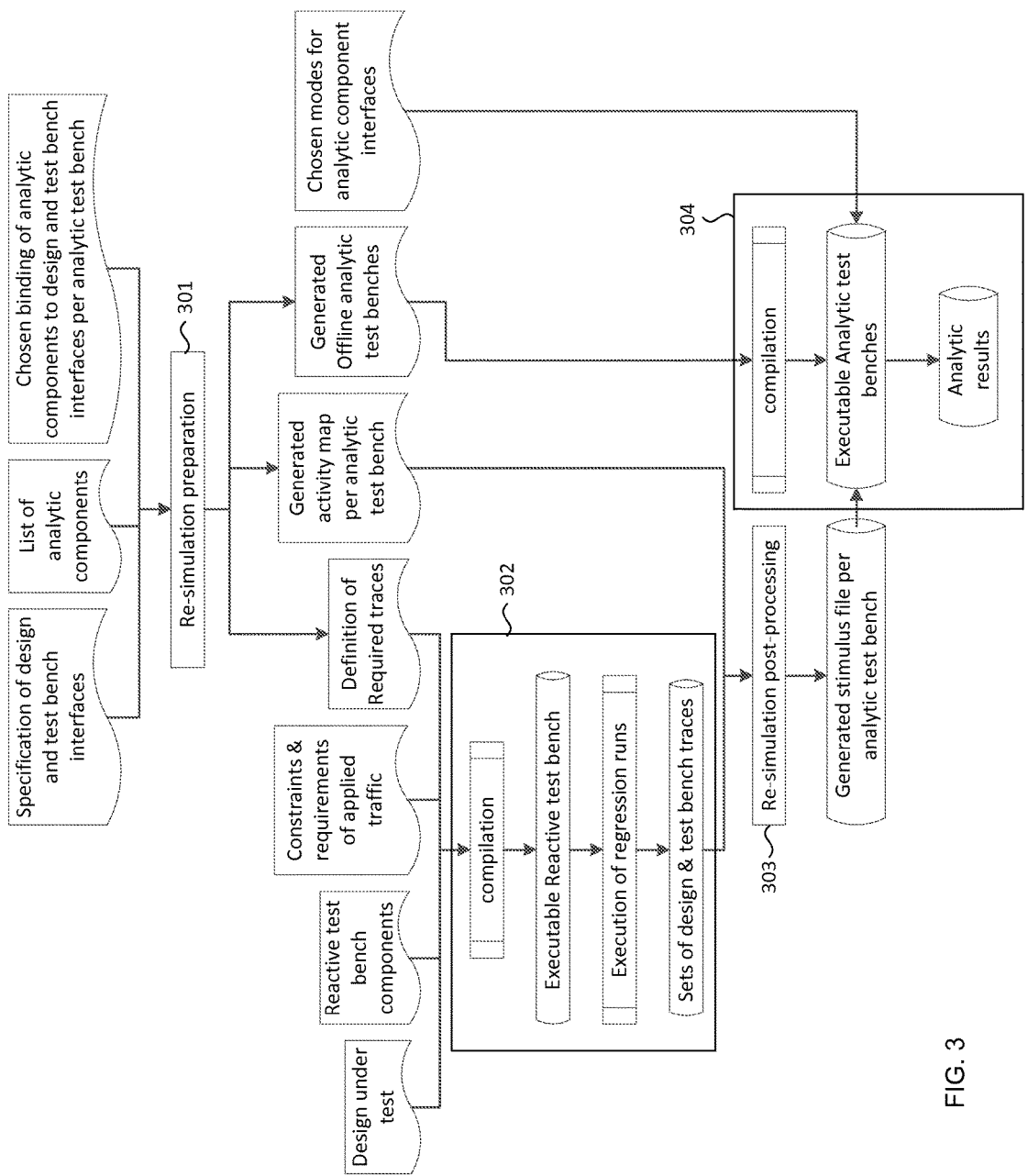
FIG. 3 is a flowchart of a re-simulation method according to an embodiment of the present disclosure.

FIG. 3 is a flowchart of a re-simulation method according to an embodiment of the present disclosure.

At 301, the re-simulation system prepares the verification environment for re-simulation. The preparation involves gathering the specification of design and test bench interfaces, the list of analytic components, and the chosen binding of analytic components to design and test bench interfaces per analytic test bench. The preparation 301 generates a definition of required traces, an activity map for each analytic test bench, and offline analytic best benches.

At 302, the reactive test bench is compiled and run (in simulation or emulation). This involves gathering the DUT 101 source code, the reactive test bench components source code, the constraints and requirements of applied traffic, and the definition of required traces generated at the preparation phase 301. Once all of this information is gathered, the reactive test bench is compiled and executed in one or more regression runs to generate sets of design and test bench traces.

At 303, the re-simulation system preforms post-processing on the generated sets of design and test bench traces. The post-processing involves gathering the generated sets of design and test bench traces and gathering the activity map for each analytic test bench that was generated at the preparation phase 301. Using this information, the post-processing generates a stimulus file for each analytic test bench.

At 304, the re-simulation system compiles one or more orthogonal analytic test benches based on the offline analytic test benches generated from the preparation phase 301. The analytic test benches are referred to as "offline" because the analytic test benches are separated and partitioned from the reactive test bench. The re-simulation system then runs each executable analytic test bench in a simulation or emulation using the stimulus generated from the re-simulation post-processing phase 303, and the chosen modes for analytic component interfaces. Since analytic components may be orthogonal (i.e., not dependent on any shared signals), each of the orthogonal analytic components may be compiled into a seperate independently-executable analytic test bench. Each independently-executable analytic test bench has stimulus generated from post-processing 303 associated respectively therewith. In this manner, analytic results may be separately generated for each orthogonal analytic component of the verification test bench; therefore, a verification team may devote engineers to developing each orthogonal analytic component separately. The engineers working on different orthogonal analytic components would not have to coordinate their development and could consequently work much more efficiently in their own teams.

Furthermore, once the re-simulation system has performed steps 301, 302, and 303 a first time, and has generated the stimulus file for each analytic test bench, the re-simulation system may execute step 304 repeatedly without having to repeat steps 301, 302, and 303. Compiling and running the reactive test bench (step 302) is typically the most time-consuming activity in verification. In a conventional integrated verification environment (that is, where the reactive and analytic components of a verification test bench are not differentiated and logically partitioned in the verification test bench), generating analytic results would require compiling and running the reactive test bench every time analytic results were desired. This conventional verification methodology is not time-efficient.

According to an embodiment of the present disclosure, the re-simulation performs steps 301-303 to generate a stimulus file for at least one analytic test bench. The re-simulation system then performs step 304 to compile and run the analytic test bench using the stimulus in order to generate analytic results. The re-simulation system further iterates the analytic component of the verification test bench (e.g., adding functional coverage definitions, fixing broken assertions, etc.) based on the analytic results. In this embodiment, the re-simulation system develops the analytic test bench iteratively by using the same copy of the stimulus generated at 303, and performing step 304 repeatedly in conjunction with analytic source code development. Advantageously, in this method of code development, the most time-consuming activity (compiling and running the reactive test bench) is only performed infrequently.

The re-simulation system of FIG. 3 provides a number of advantages to the verification environment. The complexity and integration of the simulation and emulation environment source code is constrained. Individual reactive test bench runs do not have to include specific analytical features. Individual reactive test bench runs do not have to enable or disable specific analytical features. Furthermore, optimizing regression runs is less complicated than with a single slow test bench that includes all of the reactive and analytic components.

Offline analytical runs on previously captured data are computationally simpler than the reactive test bench environment. During an offline analytical run, the design state progression does not have to be computed for either the design or for the reactive test bench elements. Moreover, analytics do not have to execute at the rate that source data was originally generated.

A key rate limiting step for analytics development is the rate that new versions of analytical elements see new behavior. If the analytics are embedded in a reactive simulator or emulator with the design, then the rate that analytics code can see new behavior is governed not just by the execution rate of the simulator or emulator but by the rate that new versions or specific modes of analytics can enter the integrated verification environment. Accordingly, both software integration effort and requirements for software stability can lower the rate of analytics development when analytic components are included with reactive components in a slow test bench. Offline analytical runs on previously captured data avoid the rate limiting step for analytics development—the rate that new analytics versions see new behavior. The re-simulation system helps to secure completion of the executable contract (assertions and functional coverage) within the project schedule by increasing the rate new analytics versions see new behavior, and by decoupling analytics development from reactive test bench runs.

Figure 4:
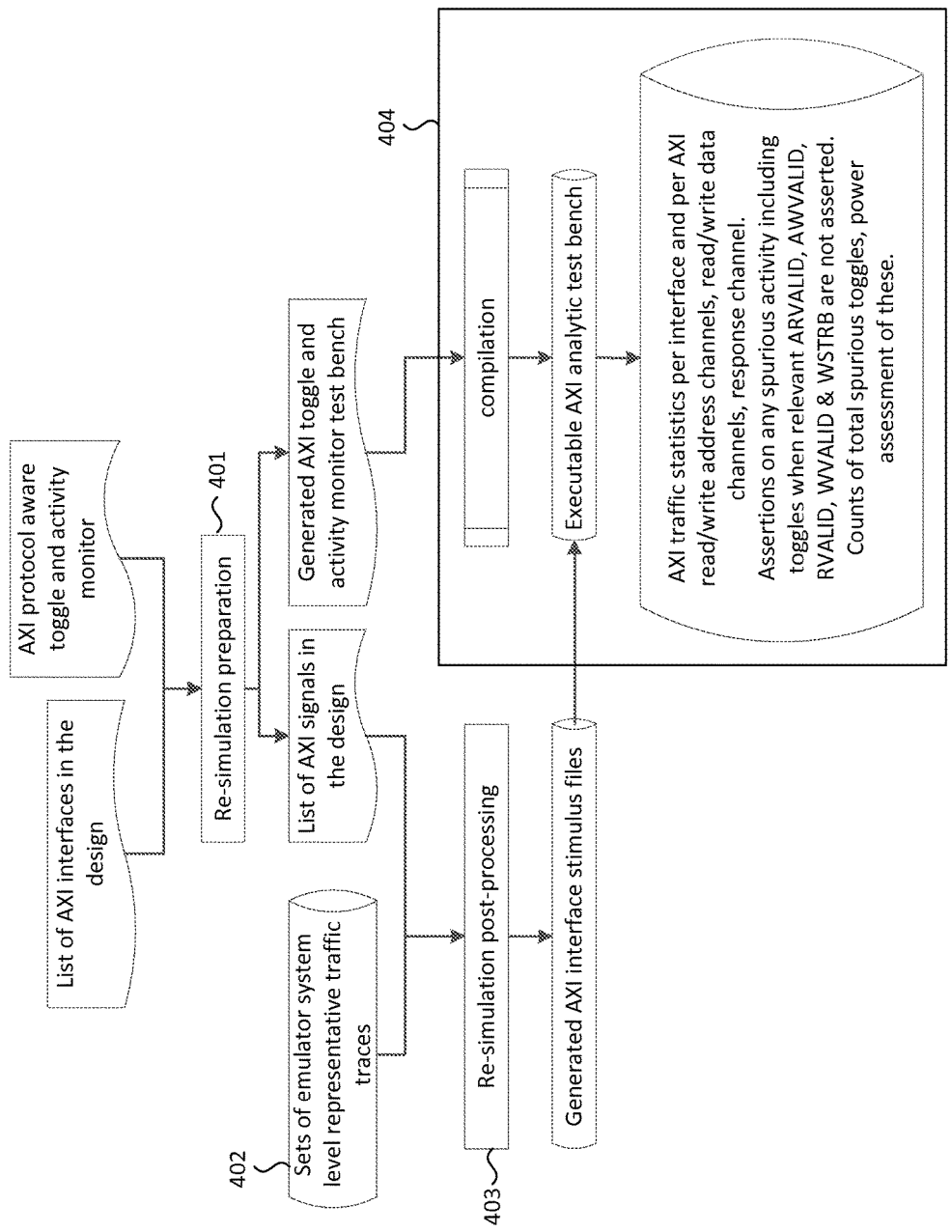
FIG. 4 is a flowchart of a re-simulation method according to an embodiment of the present disclosure.

FIG. 4 is a flowchart of a re-simulation of exemplary AXI traffic. In this example, the DUT 101 is a device that has AXI bus interfaces and the verification involves analyzing the traffic on the AXI bus interfaces.

At 401, the re-simulation system gathers a list of AXI interfaces in the design and gathers source code for an AXI protocol aware toggle activity monitor. The re-simulation system generates a list of AXI signals in the design and generates an analytic test bench comprising an AXI toggle and activity monitor.

In this example, at 402, system level tests performed on an emulator have captured design activity ("traces") under realistic traffic. This includes traffic on AXI bus interfaces. Within the emulator it is not possible to maintain precise counters on all AXI activity without impacting emulation speed. Therefore, it is particularly useful to partition the analytics from the reactive test bench in an emulation environment.

At 403, the re-simulation system performs post-processing on the captured emulation traces, and based on the list of AXI signals in the design generated from step 401, the re-simulation system generates AXI interface stimulus files for the analytic test bench.

At 404, the re-simulation system compiles the AXI toggle and activity monitor test bench and executes a regression of the compiled test bench using the AXI interface stimulus files generated at 403. The regression run generates analytics information relevant to the AXI bus interface.

The re-simulation system allows protocol-aware analysis of AXI activity throughout the design, and in this example focusing on traffic density and wasted power of spurious toggles at AXI interfaces. This analysis is possible and presents no constraint on the emulator runs other than a requirement to capture activity on the AXI interfaces.

In this embodiment, individual analytical runs can operate in a mode that halts execution on each detected spurious toggle, or operate in a mode that only reports summary statistics. New emulator runs are not required by changes to the AXI analytics or to choices in how these analytics operate. In contrast, in a conventional emulation environment, new emulator runs can be required if either the analytics change or the operational mode of the analytics change.

According to a further embodiment of the present disclosure, the re-simulation system also comprises automatically partitioning an integrated verification test bench based on an analysis of information flow within the source code of the verification test bench.

Figure 5:
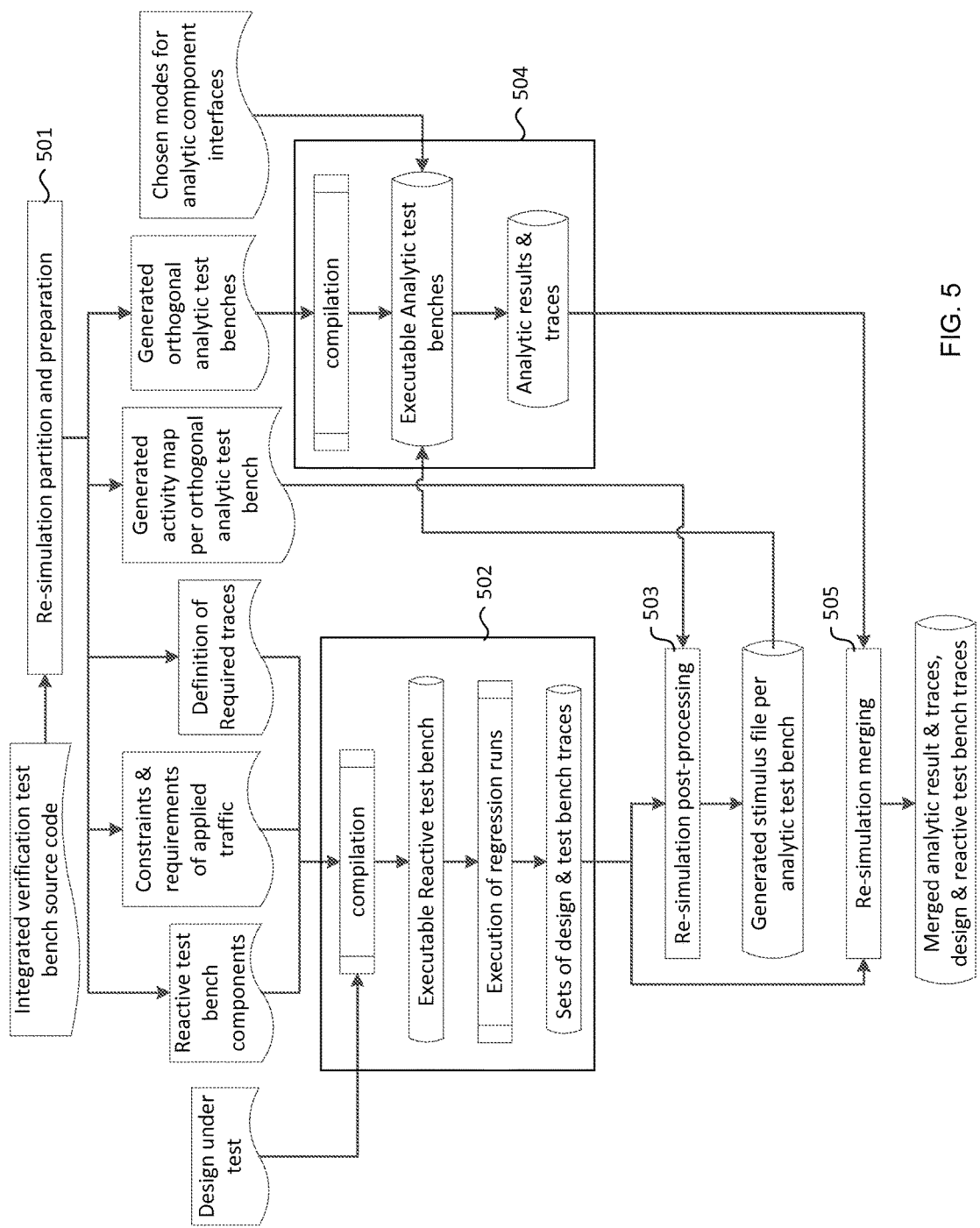
FIG. 5 is a flowchart of a re-simulation method according to an embodiment of the present disclosure.

FIG. 5 is a flowchart of a re-simulation method that also comprises automatic partitioning of the verification test bench.

At 501, the re-simulation system automatically partitions the integrated verification test bench source code into reactive and analytic components. In an embodiment, specific programming language constructs such as functional coverage and assertions can automatically be detected as analytical components and separated from the reactive components. In a further embodiment, the re-simulation system may also automatically detect the analytic boundaries in the test bench where there is a single direction of information flow from the design to the analytic components, without any information flow back to the design or between separate analytic stacks. This process would find and partition analytic test benches at orthogonal boundaries in the analytics defined by lack of information flow between these analytical elements.

The re-simulation system then prepares the verification environment for re-simulation. The preparation generates the reactive test bench components, the constraints and requirements of applied traffic, a definition of required traces, an activity map per orthogonal analytic test bench, and orthogonal analytic best benches.

At 502, the reactive test bench is compiled and run (in simulation or emulation). This involves gathering the DUT 101 source code, the reactive test bench components source code, the constraints and requirements of applied traffic, and the definition of required traces generated at the preparation phase 501. Once all of this information is gathered, the reactive test bench is compiled and executed in one or more regression runs to generate sets of design and test bench traces.

At 503, the re-simulation system preforms post-processing on the generated sets of design and test bench traces. The post-processing involves gathering the generated sets of design and test bench traces and gathering the activity map per analytic test bench that was generated at the preparation phase 501. Using this information, the post-processing generates a stimulus file for each analytic test bench.

At 504, the re-simulation system compiles one or more orthogonal analytic test benches based on the orthogonal analytic test benches generated from the preparation phase 501. The re-simulation system then runs each executable analytic test bench in a simulation or emulation using the stimulus generated from the re-simulation post-processing phase 503, and the chosen modes for analytic component interfaces. Since analytic components may be orthogonal (i.e., not dependent on any shared signals), each of the orthogonal analytic components may be compiled into a separate independently-executable analytic test bench. Each independently-executable analytic test bench has stimulus generated from post-processing 503 associated respectively with it. After one or more regressions of the executable analytic test bench is run, analytic results and traces are generated.

At 505, the re-simulation system merges the sets of design and reactive test bench traces generated at 502 with the analytic results and traces generated at 504. This merged information may then be stored in a database of the verification environment so that the results of simulation or emulations appear integrated, while the operation of verification environment is partitioned.

In the preceding description, various embodiments have been disclosed to provide numerous advantages in a verification environment. In particular, certain embodiments of the present disclosure (1) constrain the complexity and requirements of a reactive test bench; (2) reduce the time required in using an expensive reactive test bench; (3) decouple feature delivery in the design and the reactive test bench from feature delivery in analytic elements of the test bench; (4) decouple analytical modes from data capture by the reactive test bench, allowing various analytical features to be flexibly enabled or disabled iteratively offline; and/or (5) decouple orthogonal analytic features from each other for faster regression closure.

Constraining the complexity and requirements of the reactive test bench means that offline analytics cannot impact the execution speed nor memory requirements of the reactive test bench. It is a consequential requirement of any test plan that analytical elements observe the operation of the design to evaluate correct operation and completeness of test. However, it is not necessarily a requirement that analytical components evaluate the design operation concurrently, during the simulation of the design. Live analysis can introduce a performance or resource constraint on any analytical component and the test environment that in turn can incur further development costs. Avoiding these costs is achieved by offline analytical analysis of data previously collected while the design operated. In some cases, such as in emulation systems, it is not possible to meet necessary speed or resource constraints required of analytics and offline analysis is the only choice.

Reducing the time required in using an expensive reactive test bench means that opportunity costs can be controlled. Stimulating, reacting to, and capturing the operation of the design together require a test environment of a minimum complexity. This minimum complexity in turn results in a minimum opportunity cost. Offline development of analytical components controls this opportunity cost because several analytical components can be iteratively developed and executed concurrently without direct use of the expensive, complex test environment.

Decoupling feature delivery in the design and the reactive test bench from feature delivery in analytic elements of the test bench removes the requirement that specific features of analytical components are only available when data is captured. At the start of the project this can allow a team to focus on device bring-up, storing traces for offline analysis by independent teams that are concurrently developing analytics. At the end of the project, this can allow a team to focus on test plan closure, without a requirement to recapture design activity after revisions of analytical components. Analytical requirements can be discovered and delivered outside of revisions to the reactive test bench.

Decoupling analytical modes from data capture by the reactive test bench allows various analytical features to be flexibly enabled or disabled iteratively offline. Analytical elements of a test bench typically have modes of operation where varying levels of information are examined, retained or reported. These analytical modes allow users to flexibly focus on the task at hand, rationalizing execution speed, disk space, and parsing of the results. If analytical elements execute outside of the reactive test bench then it is not necessary to have these elements configured for a specific investigation during data extraction. Instead, users can reconfigure analytical elements offline as often as necessary to complete the current task without returning to capture data with analytics reconfigured as necessary. This decoupling reduces total time required in the high opportunity cost reactive test bench.

Decoupling orthogonal analytic features from each other promotes faster regression closure. Many analytics are orthogonal, and these can be separately managed by independent analytical test benches, with separate analytical regression runs that may be performed concurrently. This helps a team iterate on analytic objectives both more quickly and with tighter focus. Analytical test benches can be automatically generated so this partitioning can be flexibly adjusted to suit current needs through the project at reduced cost.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A method of testing a design under test (DUT) using a verification test bench, the method comprising:
   obtaining a computer-readable source code of the DUT and a computer-readable source code of the verification test bench;
   separating the computer-readable source code of the verification test bench into reactive components and analytic components, the reactive components for sending test traffic to the DUT and for receiving test traffic from the DUT, the analytic components for verifying the test traffic between the reactive components and the DUT;
   compiling, at a computer processor, the reactive components and the computer-readable source code of the DUT into a first computer-executable test bench;
   compiling, at the computer processor, the analytic components into a second computer-executable test bench;
   running the first computer-executable test bench on a simulator program of the computer processor to generate test traffic between the reactive components and the DUT;
   separately running the second computer-executable test bench on the simulator program of the computer processor to verify the test traffic; and
   outputting an indication of whether the second computer-executable test bench verified the test traffic as a successful simulation of the DUT or as a failed simulation of the DUT.

2. The method of claim 1, further comprising separating the analytic components based on specific programming language constructs.

3. The method of claim 1, further comprising separating the analytic components based on an analysis of information flow within the source code.

4. The method of claim 1, further comprising:
   separating the computer-readable source code of the verification test bench into a first orthogonal portion of the analytic components;
   separating the computer-readable source code of the verification test bench into a second orthogonal portion of the analytic components;
   compiling, at the computer processor, the first orthogonal portion of the analytic components into a third computer-executable test bench;
   compiling, at the computer processor, the second orthogonal portion of the analytic components into a fourth computer-executable test bench;
   running the third computer-executable test bench on the simulator program of the computer processor; and
   running the fourth computer-executable test bench on the simulator program of the computer processor separately from the third computer-executable test bench.

5. The method of claim 1, further comprising:
   recording the test traffic generated from the first computer-executable test bench simulation; and
   providing the test traffic to the second computer-executable test bench simulation to verify the test traffic.

6. The method of claim 5 comprising:
   storing the recorded test traffic; and
   iteratively updating the analytic components and providing the stored test traffic to the second computer-executable test bench simulation, in order to improve the verification of the test traffic.

7. A method of testing a design under test (DUT) using a verification test bench, the method comprising:
   obtaining a computer-readable source code of the DUT and a computer-readable source code of the verification test bench;
   separating the computer-readable source code of the verification test bench into reactive components and analytic components, the reactive components for sending test traffic to the DUT and for receiving test traffic from the DUT, the analytic components for verifying the test traffic between the reactive components and the DUT;
   compiling, at a computer processor, the reactive components and the computer-readable source code of the DUT into a first computer-executable test bench;
   compiling, at the computer processor, the analytic components into a second computer-executable test bench;
   running the first computer-executable test bench on a hardware emulator apparatus to generate test traffic between the reactive components and the DUT;
   separately running the second executable test bench on the hardware emulator apparatus to verify the test traffic; and
   outputting an indication of whether the second computer-executable test bench verified the test traffic as a successful simulation of the DUT or as a failed simulation of the DUT.

8. The method of claim 7, further comprising:
recording the test traffic generated from the first computer-executable test bench emulation; and
providing the test traffic to the second computer-executable test bench emulation to verify the test traffic.

9. The method of claim 8, further comprising:
storing the recorded test traffic; and
iteratively updating the analytic components and providing the stored test traffic to the second computer-executable test bench emulation, in order to improve the verification of the test traffic.

* * * * *